United States Patent [19]

Chai

[11] Patent Number: 5,606,522

[45] Date of Patent: Feb. 25, 1997

[54] NON-VOLATILE ANALOG MEMORY

[75] Inventor: Yong-Yoong Chai, Seungnam, Rep. of Korea

[73] Assignee: Samsung Electronics Co., Ltd., Suwon, Rep. of Korea

[21] Appl. No.: 575,279

[22] Filed: Dec. 20, 1995

[51] Int. Cl.$^6$ .................................................. G11C 11/34
[52] U.S. Cl. .................. 365/185.03; 365/45; 365/155.29
[58] Field of Search ......................... 365/185.03, 185.18, 365/185.29, 189.07, 45, 168

[56] References Cited

U.S. PATENT DOCUMENTS 5,028,810  7/1991  Castro et al. ...................... 365/185.03

OTHER PUBLICATIONS

"A Non–Volatile Analog Storage Device Using EEPROM Technology," by Trevor Blyth, Sakhawat Khan, and Richard Simko. 1991 IEEE International Solid–State Circuits Conference, Feb. 1991.

"An Analog Trimming Circuit Based on a Floating–Gate Device," by Eduard Sackinger and Walter Guggenbuhl. IEEE Journal of Solid–State Circuits, vol. 23, No. 6, Dec. 1988.

"Trimming Analog Circuits Using Floating–Gate Analog MOS Memory," by L. Richard Carley; IEEE Journal of Solid–State Circuits. vol. 24, No. 6, Dec. 1989.

"Floating Gate MOSFWET With Reduced Programming Voltage," by Y.–Y. Chai and L. G. Johnson; Electronics Letters, 1st Sep. 1994, vol. 30 No. 18.

*Primary Examiner*—David C. Nelms
*Assistant Examiner*—Huan Hoang

[57] ABSTRACT

An analog memory includes a cell array, a comparator, a mode selector, and a controller. The cell array includes a plurality of memory cells each having a control gate an injector, and a floating gate, and a first input part of a differential input stage. A first high-voltage pulse signal is applied to the control gate and a second high-voltage pulse signal is applied to the injector. Charges are injected into or are erased from the floating gate through the injector. The comparator has a differential input port whose first input is a reference voltage signal and whose second input is a floating gate voltage signal of one of the plurality of memory cells. The comparator compares and outputs the difference between the reference voltage signal and the floating gate voltage signal. The mode selector connects the output of the comparator to the first input, functions as a unit amplifier during a reading mode, and connects the external reference voltage signal to the first input of the comparator during a writing mode. The controller maintains a program enable state if the current state of the comparator output signal is the same as its previous state and maintains a program disable state if the current state is different from the previous state. The controller generates first and second high-voltage pulse signals according to the state of the comparator output signal. The analog memory reduces the programming voltage, allows for fast programming operations, and increases memory life.

6 Claims, 6 Drawing Sheets

NON-VOLATILE ANALOG MEMORY

BACKGROUND OF THE INVENTION

The present invention relates to a semiconductor memory. More particularly, the present invention relates to a non-volatile analog memory which can store analog information.

Digital memories have been widely used as information storage media because of their fast random access and small, light, and simple controllers. Such digital memories store either a logic "0" or "1" in a memory cell. In order to increase the storage capability for a given physical dimension of the memory, the size of an individual memory cell must be reduced. However, the reduction of a cell size is limited in view of the current state of manufacturing technology.

Currently, 64 Mbit digital memories and 256 Mbit digital memories are under mass-production, and 1 Gbit and 4 Gbit digital memories are being experimentally manufactured. Using the current manufacturing technology, however, it is difficult to manufacture a digital memory having more than 4 Gbit storage capacity.

In order to overcome the limitation of the technical storage capacity of the digital memory, research into an analog memory which can store multiple values instead of binary values in a memory cell is currently under way. For example, conventional analog memories are disclosed in L. R. Carley, "Trimming analog circuit using floating-gate analog MOS memory," IEEE J. Solid-state circuits, Vol. 24, pp. 1569–1575, (December 1989), T. Blyth, et al., "A non-volatile analog storage device using EEPROM technology" J. ISSCC Digest of Technical Papers, pp. 192–193, (February, 1991), T. Blyth, et al., "An analog trimming circuit based on a floating-gate device", IEEE Electron Device Letters, Vol. 23, pp. 1437–1440, (December 1988).

The conventional analog memory has inherent drawbacks, however, in that it requires a special fabrication process with an ultra thin oxide. In addition, conventional analog memories use inefficient erasing and programming operations.

SUMMARY OF THE INVENTION

In order to solve the problems of the conventional art, it is an object of the present invention to provide an analog memory which can be fabricated by a standard digital memory fabrication process, and which has efficient erasing, reading, and writing operations.

It is another object of the present invention to provide an analog memory which can eliminate input offset errors by making input and output paths the same.

To accomplish the above objects, there is provided an analog memory according to the present invention comprising: a memory cell comprising a control gate to which a first high-voltage pulse signal is applied, an injector to which a second high-voltage pulse signal is applied, and a floating gate to which charges are injected or erased through the injector; comparing means having a differential input stage with a reference voltage signal as a first input and a voltage signal of the floating gate as a second input, the comparing means operating to compare and output the difference between the first and second input signals; mode selecting means for connecting the output of the comparing means to the first input to function as a unit amplifier during a reading mode, and for connecting external reference voltage signal to the first input of the comparing means during a writing mode; and controlling means for maintaining a program enable state if a current state of the output signal of the comparing means is the same as a previous state of the output signal of the comparing means, for maintaining a program disable state if the current state of the output signal of the comparing means is not the same as a previous state of the output signal of the comparing means, and for generating the first and second high-voltage pulse signals in accordance with the state of the output signal of the comparing means, wherein during the programming operation, analog information is programmed in the memory cell such that charges are injected into or erased from the floating gate, and wherein, during the reading operation, the floating gate voltage signal is unit-gain-amplified and then output.

According to another aspect of the present invention, there is provided an analog memory comprising: a cell array comprising a plurality of memory cells, each memory cell having a control gate to which a first high-voltage pulse signal is applied, an injector to which a second high-voltage pulse signal is applied, and a floating gate to which charges are injected into or are erased from through the injector, each memory cell being selected in response to an external address signal, the floating gate being one input part of a differential input stage; comparing means having the differential input stage with a reference voltage acting as a first input and a floating gate voltage signal of a memory cell selected from the plurality of memory cells acting as a second input, the comparing means acting to compare and output the difference between the reference voltage signal and the floating gate voltage signal; mode selecting means for connecting the output of the comparing means to the first input of the comparing means to cause the comparing means to function as a unit amplifier during a reading mode, and for connecting an external reference voltage signal to the first input of the comparing means during a writing mode; and controlling means for maintaining a program enable state if the current state of the output signal of the comparing means is the same as that previous state of the output signal of the comparing means, maintaining a program disable state if the current state of the output signal of the comparing means is not the same as the previous state of the output signal of the comparing means, and for generating the first and second high-voltage pulse signals in accordance with the state of the output signal of the comparing means, wherein during the writing operation, analog information is written into the memory cell by injecting charges into the floating gate or erasing charges from the floating gate, and wherein during the reading operation, the floating gate voltage signal is amplified and then output.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
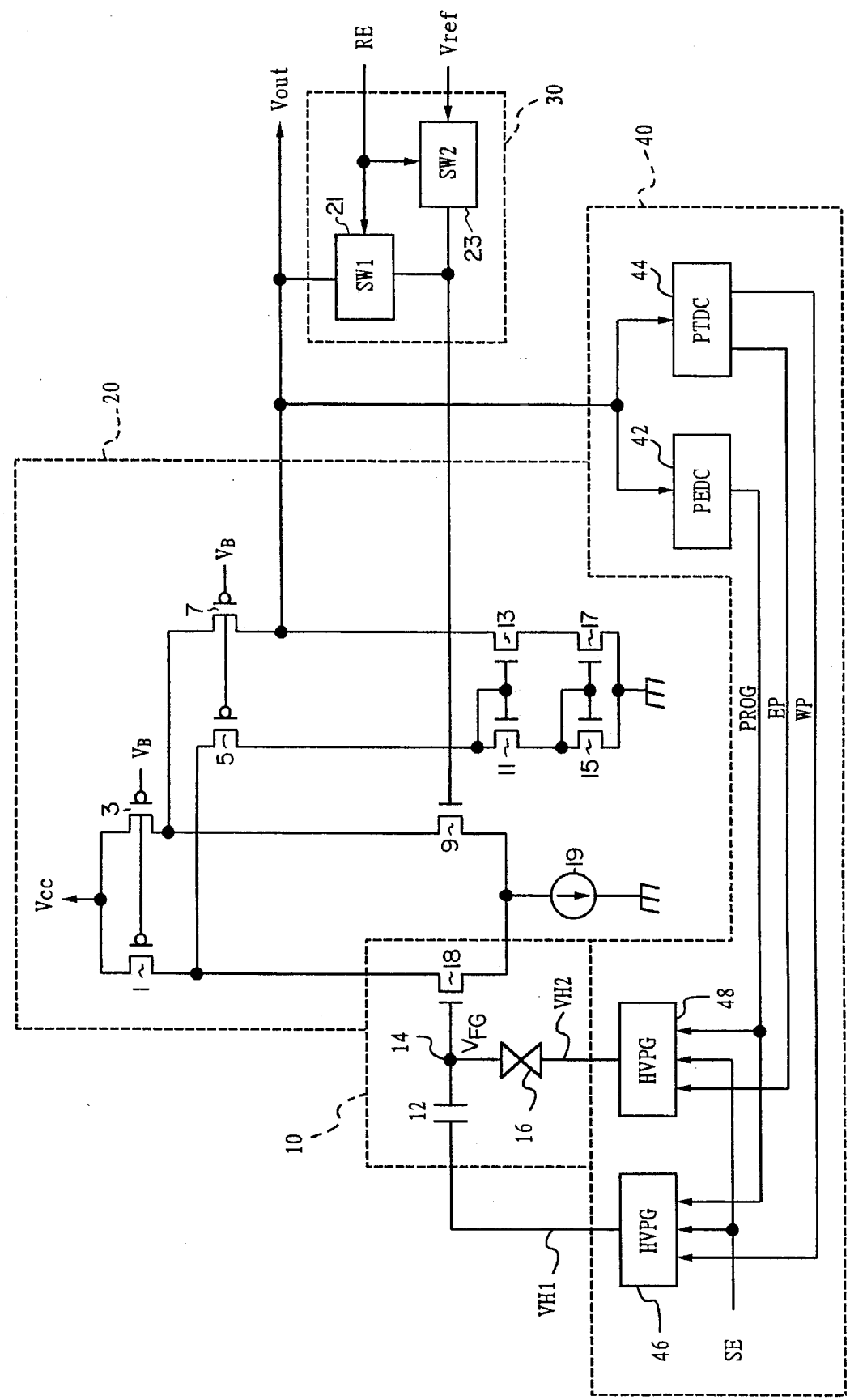
FIG. 1 is a circuit diagram of a nonvolatile analog memory according to a preferred embodiment of the present invention.

The analog memory shown in FIG. 1 includes a memory cell 10, a comparator 20, a mode selector 30, and a controller 40.

The memory cell 10 comprises a single cell transistor 18, a control gate 12 for the single cell transistor 18, an injector 16, and a floating gate 14. The control gate 12 receives a first high-voltage pulse signal VH1, and the injector 16 receives a second high-voltage pulse signal VH2. The floating gate 14 can either have charge directed to it discharged from it through the injector 16. A preferred configuration of the memory cell 10 is described in detail in Y. Y. Chai, et al., "Floating gate MOSFET with reduced programming voltage," Electronics Letters, Vol. 30, No. 18, pp. 1536–1537, (Sep. 1, 1994), the contents of which are hereby incorporated by reference.

The comparator 20 comprises first through fifth NMOS transistors 9, 11, 13, 15, and 17, a common current source 19, and first through fourth PMOS transistors 1, 3, 5, and 7. The first NMOS transistor 9 and the single cell transistor 18 from the memory cell 10 form a differential input stage whose first input is a reference voltage signal $V_{ref}$ and whose second input is floating gate voltage signal $V_{FG}$ of memory cell 10. A biasing voltage VB is applied to the gate of first through fourth PMOS transistors 1, 3, 5, and 7, which are supplied as the active loads. In the comparator 20, the comparator output signal $V_{out}$ becomes high if the level of the floating gate voltage signal $V_{FG}$ and the level of the reference voltage signal $V_{ref}$ are substantially different.

The mode selector 30 comprises first and second switches 21 and 23, which are switched in opposite phases in response to a read control signal RE. During a high state reading mode, the mode selector 30 turns the first switch 21 on, turns the second switch 23 off, and connects the output of comparator 20 to the gate of the first NMOS transistor 9 of the differential input stage of comparator 20. This causes the comparator 20 to function as a unit gain amplifier. During a low state writing mode, the mode selector 30 turns the first switch 21 off, turns the second switch 23 on, and connects the external reference voltage $V_{ref}$ to the gate of the first NMOS transistor 9 of differential input stage of comparator 20. This causes the comparator 20 to function as a comparator for the two input signals $V_{FG}$ and $V_{ref}$.

The controller 40 comprises a program enable detector (PEDC) 42, a program type detector (PTDC) 44, a first high-voltage pulse generator (HVPG) 46, and a second high-voltage pulse generator (HVPG) 48.

Figure 2:
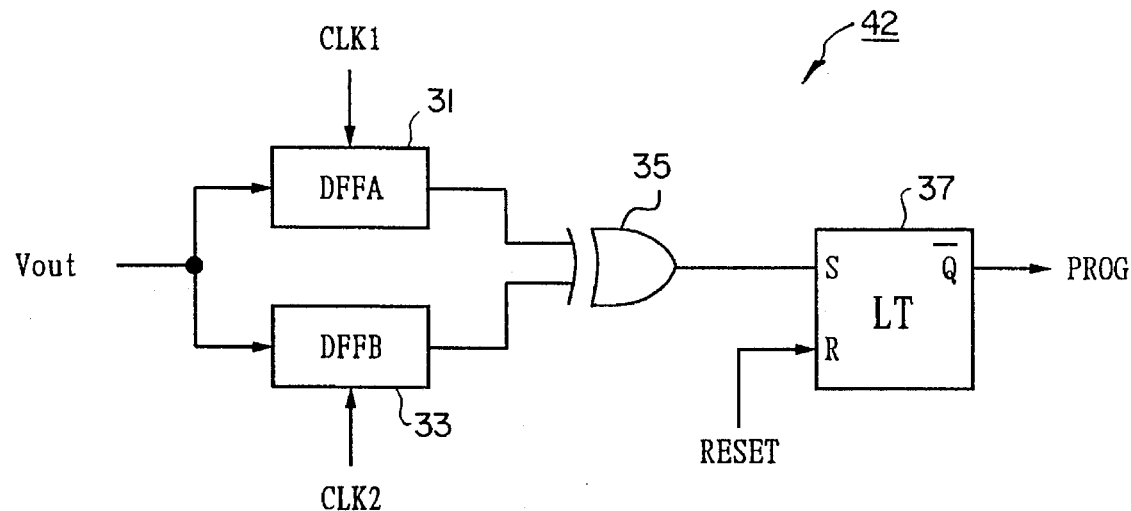
FIG. 2 is a circuit diagram of a program enable detector shown in FIG. 1.

Referring to FIG. 2, the program enable detector 42 controls the beginning and ending of a program by sampling the output signal $V_{out}$ of comparator 20 during a predetermined time interval to check for a change in the output signal state. The program enable detector 42 comprises a first flip-flop 31, a second flip-flop 33, an XOR gate 35, and a latch 37.

The first flip-flop 31 samples the output signal $V_{out}$ at a rising edge of a first clock signal CLK1. The a second flip-flop 33 samples the output signal $V_{out}$ at a rising edge of a second clock signal CLK2. The XOR gate 35 detects the consistency or inconsistency of the output state of the first and second flip-flops 31 and 33. The latch 37 latches the output of the XOR gate 35. In the program enable detector 42, the first and second clock signals CLK1 and CLK2 do not overlap, but form clock waveforms having opposite phases.

The output signal PROG of program enable detector 42 rises to a "high" level if the comparator output state sampled from the first clock signal CLK1, i.e., the previous state, and the comparator output state sampled from the second clock signal CLK2, i.e., the current state, are the same. This serves to enable the programming, or writing, operation of the memory cell 10. If the previous state and the current state are different from each other, however, the output signal PROG of program enable detector 42 falls to a "low" level. This serves to disable the programming, or writing, operation of the memory cell 10. Based on the results of the comparison from the comparator 20, a programming voltage may be applied to the control gate 12 or the injector 16 between the first clock signal CLK1 and the second clock signal CLK2.

In other words, if a difference exists between the two input signals of the differential input stage and then the voltage of floating gate 14 of the memory cell is increased or decreased through the injector 16 to reach a level similar to an external reference voltage, i.e., a target voltage, the output state of comparator 20 changes from a high or low state to a low or high state. This change is detected for controlling the start and termination of the program.

Figure 3:
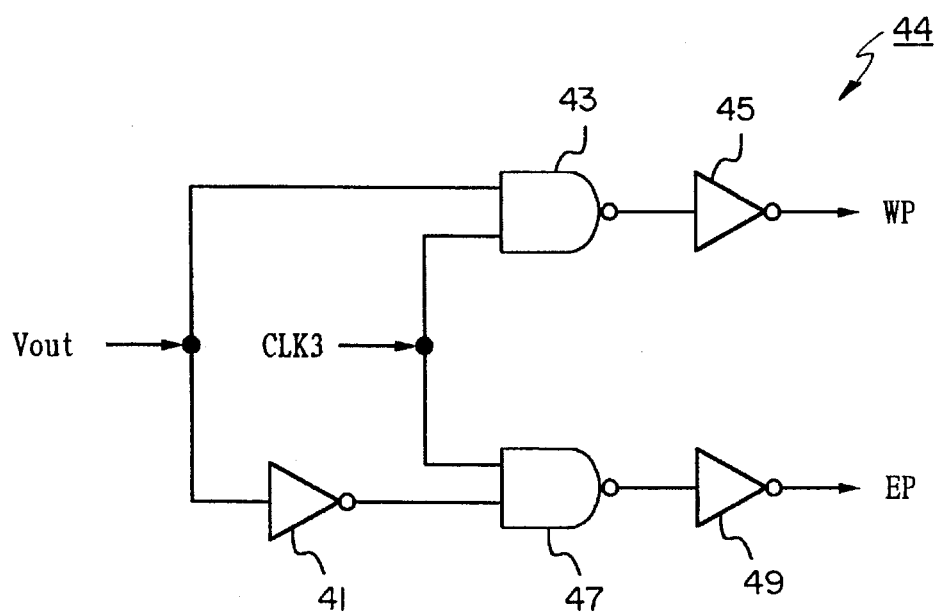
FIG. 3 is a circuit diagram of a program type detector shown in FIG. 1.

Referring to FIG. 3, program type detector 44 comprises first and second NAND gates 43 and 47, and first through third inverter gates 41, 45, and 49. The output signal $V_{out}$ of comparator 20 is applied directly to an input of the first NAND gate 43, and is applied through the first inverter gate 41 to an input of the second NAND gate 47. The first NAND gate 43 and the second inverter 45 output a high state write mode signal WP in response to a third clock signal CLK3 when $V_{out}$ is high, the second NAND gate 47 and the third inverter 49 output a high state erase mode signal EP in response to the third clock signal CLK3 when $V_{out}$ is low. In this way, the program type detector 44 operates to generate either a write mode signal WP or an erase mode signal EP in accordance with the state of the output signal $V_{out}$ of the comparator 20.

Thus, if the voltage signal $V_{FG}$ of the floating gate 14 is higher than the reference voltage signal $V_{ref}$, the program type detector 44 will generate a high-state write mode signal WP. This will instruct a first high voltage pulse generator 46 to inject electrons into the floating gate 14 via the injector 16 and will thereby lower the voltage level $V_{FG}$ of floating gate 14 to a level similar to that of the reference voltage signal $V_{ref}$.

If, however, the voltage signal $V_{FG}$ of the floating gate 14 is lower than the reference voltage signal $V_{ref}$, the output $V_{out}$ of the comparator 20 will be low and a low-state erase mode signal EP will be generated by the program type detector 44. This will instruct a second high voltage pulse generator 48 to drain electrons from the floating gate 14 via the injector 16 and will thereby raise the voltage level of the floating gate 14 to a level similar to that of the reference voltage signal.

The first high-voltage pulse generator 46 and the second high-voltage pulse generator 48 preferably have the same circuit configuration as each other. They differ in that the first high-voltage pulse generator 46 is connected to the control gate 12 and is controlled by the write mode signal, and the second high-voltage pulse generator 48 is connected to the injector 16 and is controlled by the erase mode signal EP.

Figure 4:
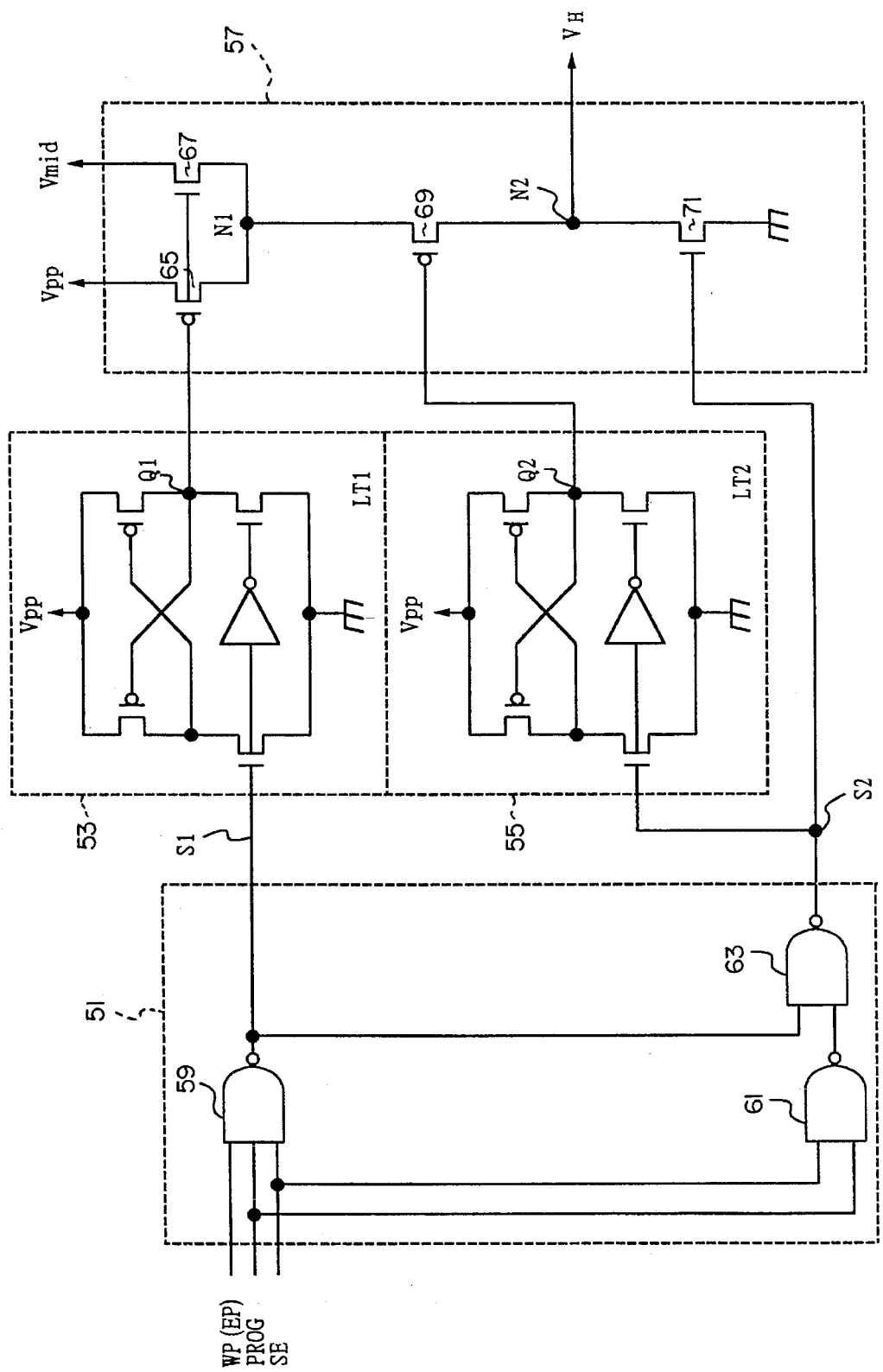
FIG. 4 is a circuit diagram of a high-voltage pulse generator shown in FIG. 1.

Referring to FIG. 4, high-voltage pulse generator 46 and 48 each comprise a logic circuit 51, a first latch 53, a second latch 55, and a driver 57. The logic circuit 51 comprises third through fifth NAND gates 59, 61, and 63 for combining the write or erase signal WP or EP, a detection signal PROG output from program enable detector 42 and a selection signal SE to generate first and second control signals S1 and S2. The first latch 53 latches the first control signal S1, and the second latch 55 latches the second control signal S2. The driver 57 outputs a high-voltage pulse signal $V_H$ in response to the output signals Q1 and Q2 of first and second latches 53 and 55 and the second control signal S2.

Driver 57 comprises fifth and sixth PMOS transistors 65 and 69 and sixth and seventh NMOS transistors 67 and 71. The fifth PMOS transistor 65 is connected between a high-voltage (programming voltage) $V_{pp}$ of preferably about 15 V and a first node N1, and is switched in response to the output signal Q1 of first latch 53, The sixth NMOS transistor 67 is connected between an intermediate-voltage $V_{mid}$ of about 7.5 V and the first node N1, and is also switched in response to the output signal Q1 of first latch 53. The sixth PMOS transistor 69 is connected between the first node N1 and a second node N2, and is switched in response to the output signal Q2 of second latch 55. The seventh NMOS transistor 71 is connected between the second node N2 and ground, and is switched in response to the second control signal S2.

The operation of high-voltage pulse generators 46 and 48 of the preferred embodiment is summarized in the following Table 1.

TABLE 1

| SE | PROG | WP/EP | S1 | S2 | Q1 | Q2 | $V_H$ |
|---|---|---|---|---|---|---|---|
| H | H | H | L | L | L | L | $V_{pp}$ |
| H | H | L | H | H | H | H | GND |
| H | L | H | H | H | H | H | GND |
| H | L | L | H | H | H | H | GND |
| L | H | H | H | L | H | L | $V_{mid}$ |
| L | H | L | H | L | H | L | $V_{mid}$ |
| L | L | H | H | H | H | H | GND |
| L | L | L | H | H | H | H | GND |

Figure 5:
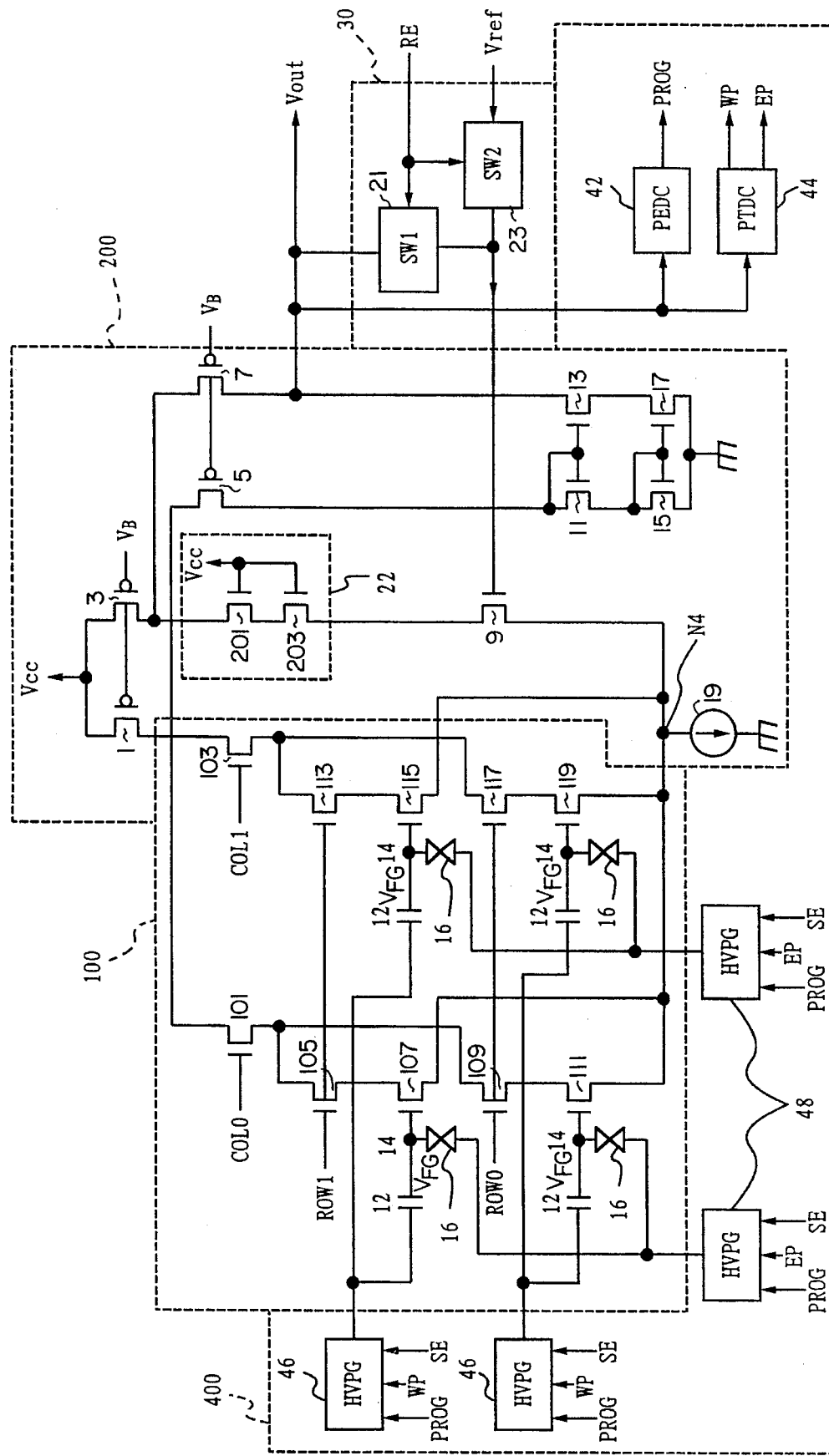
FIG. 5 is a circuit diagram of an analog memory having a 2×2 cell array according to a preferred embodiment of the present invention.

As shown in Table 1, the high-voltage pulse generators 46 and 48 output a high voltage $V_{pp}$ when selected and output $V_{mid}$ or GND when they are not selected. FIG. 5 is a schematic diagram of an analog memory having a 2×2 cell array according to a preferred embodiment of the present invention. Elements that are the same as those in the memory of FIG. 1 are designated by the same reference numerals, and their detailed description will be omitted.

The analog memory shown in FIG. 5 comprises a cell array 100, a comparator 200, a mode selector 30, and a controller 400. The cell array 100, the comparator 200, and the controller 400 correspond to the memory cell 10, the comparator 20 and the controller 40 shown in FIG. 1, respectively.

The cell array 100 is constructed such that among 2×2 memory cells, only one memory cell, selected by column and row selection signals COL0, COL1, ROW0 and ROW1, is connected to one side of a differential input stage of the comparator 200. Each of the first through fourth cell transistors 107, 111, 115, and 119 is connected to the corresponding column via first through fourth row selecting transistors 105, 109, 113, and 117 to which the row selection signals ROW0 and ROW1 are applied. The respective columns are connected to the load of one side of comparator 200 via first and second column selecting transistors 101 and 103 to which the column selection signals COL0 and COL1 are applied. The other side of the respective cell transistors 107, 111, 115, and 119 is commonly connected to a fourth node N4. The first and second column selecting transistors 101 and 103 and the first through fourth row selecting transistors 105, 109, 113, and 117 are preferably NMOS transistors.

The comparator 200 comprises a balancing means 22 between the second load transistor 3 and an input transistor 9 and serves to eliminate the unbalance due to the interposition of column and row selecting transistors between the first load transistor 1 and the third cell transistor 113. Balancing means 22 comprises eighth and ninth NMOS transistors 201 and 203 whose number is the same as that of column and row selecting transistors (103 and 113). A power voltage $V_{cc}$ is applied to the gates the eight and ninth NMOS transistors 201 and 203.

The controller 400 comprises a plurality of first high-voltage pulse generators (HVPG) 46 in respective rows for commonly supplying a first high-voltage to a control gate 12 of memory cells in the same column. Similarly, controller 400 includes second high-voltage pulse generators (HVPG) 48 in the respective columns for commonly supplying a second high-voltage to an injector 16 of memory cells in the same column.

Therefore, if the selection signals ROW0 and COL0 both become a high state by an address signal, the second cell transistor 111, positioned in a crossing point of column 0 and row 0, is selected to be connected to comparator 200.

At this time, a selection signal SE of a high state is supplied only to the first high-voltage pulse generator 46 corresponding to column 0 and to the second high-voltage pulse generator 46 of corresponding to row 0. Selection signals of a low state are applied to the first and second high-voltage pulse generators 46 and 48 of the other columns and rows.

Therefore, during a programming mode, first and second high-voltage pulse generators 46 and 48 are selected by the program enable detector (PEDC) 42 and the program type detector (PTDC) 44 of the controller 400 depending on the magnitudes of the floating gate voltage signal $V_{FG}$ of the selected cell and the reference voltage signal $V_{ref}$. The selected HVPGs 46 and 48 are controlled so that high-voltages corresponding to a write or erase operation are applied to the control gate 12 or the injector 16 of the selected cell, respectively. In this way, the circuit adjusts the voltage level of the floating gate voltage signal to be nearly same with that of the reference voltage signal.

For example, if the voltage level $V_{FG}$ of the floating gate 14 is higher than that of the reference voltage $V_{ref}$, then the high voltage $V_{pp}$ is applied to control gate 12 of the second cell transistor 111 and the ground voltage GND is applied to injector 16 so that electrons are injected into floating gate via injector 16 due to the voltage difference of $V_{pp}$. Therefore, the voltage level $V_{FG}$ of the floating gate 14 is reduced to a level similar to that of the reference voltage $V_{ref}$. At this time, the voltage difference applied between the control gate 12 and injector 16 of a non-selected cell is maintained as $V_{mid}(V_{pp}-V_{mid})$, $V_{mid}(V_{mid}-GND)$ and 0 V ($V_{mid}-V_{mid}$) at first, third, and fourth cell transistors 107, 115, and 119, respectively.

Figure 7:
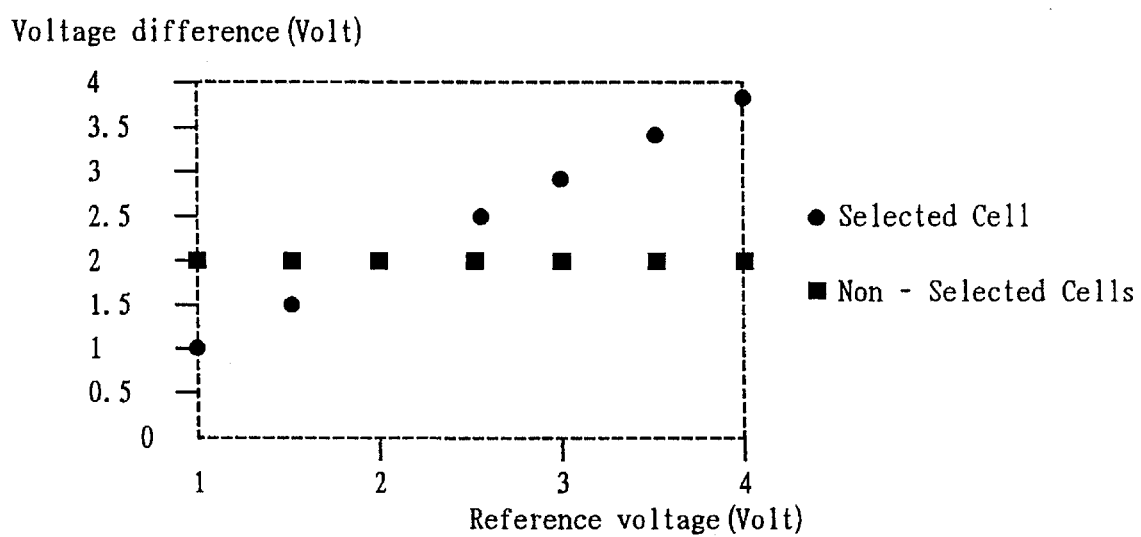
FIG. 7 is a graph showing the information change of adjacent cells during a programming, or writing, operation of a selected cell of the analog memory according to a preferred embodiment of the present invention.

The data change of the adjacent non-selected cell is not disturbed since, during the programming operation of a selected cell, the voltage difference applied to an adjacent cell is maintained to a programming voltage $V_{pp}$ or below, a level at which a tunneling phenomenon will not occur. Referring to FIG. 7, if non-selected cells are initially programmed with 2 V, the voltage change of a selected cell from 1 V to 4 V does not even disturb the data.

During the reading mode, the floating gate voltage signal of a selected cell is output via comparator 200, which functions as a unit gain amplifier. In other words, in the present invention, information is written in a memory cell through comparator 200 during the writing operation, and the information stored in the memory cell is amplified to be output during the reading operation through an amplifier comprising a comparator 200. In this way, the paths are the same for input and output, which eliminates input offset errors of the comparator.

Figure 6:
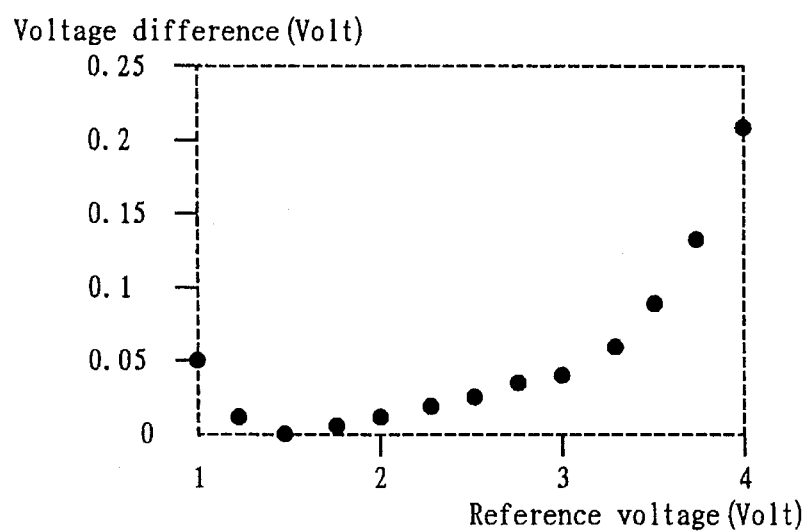
FIG. 6 is a graph showing the difference between a reference voltage and a read voltage during the reading operation of the analog memory according to a preferred embodiment of the present invention.

Referring to FIG. 6, the voltages output in the reading mode have an average difference of about 50 mV. Therefore, the reading errors are the lowest in the range of 1.25 V to 2 V. In this range, if the resolution is 10 mV, the information corresponding to at least six digital cells can be stored in a single cell. In other words, the circuit of the present invention improves the memory capacity by at least six times as compared to the memory capacity of a digital memory.

Figure 8:
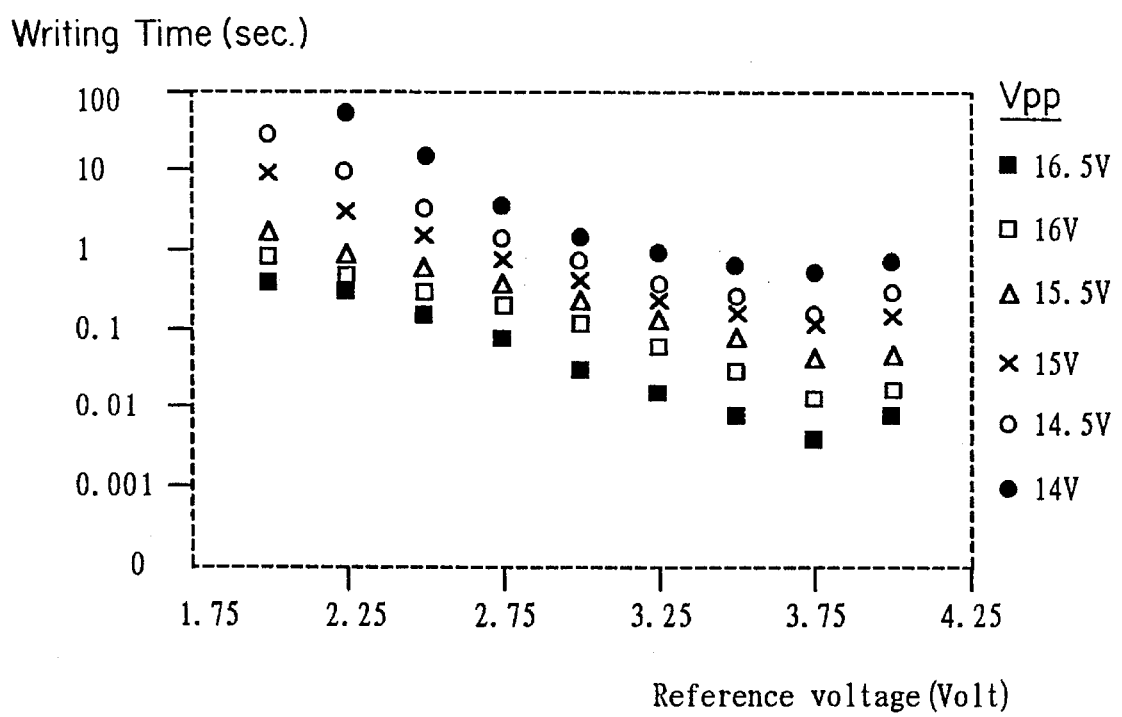
FIG. 8 is a graph showing the writing time depending on a programming voltage and a reference voltage.

Referring to FIG. 8, the larger the programming voltage $V_{pp}$, the shorter the programming time. Also, the larger the reference voltage, the shorter the programming time. In other words, in the present invention, since the magnitude of the programming voltage is adjusted depending on the difference between the floating gate voltage and reference voltage, the programming time decreases according to increases in the programming voltage.

The present invention as described above with respect to a preferred embodiment has a number of advantages over conventional digital memories. Fore example, the programming operation occurs at any voltage level irrespective of the current floating gate voltage. Also, a separate erase operation is not necessary before performing the programming operation. Starting the programming operation freely decreases the time for total programming. Also, the reduction of an oxide layer stress amount makes the life of the memory device longer.

In addition, the input offset voltage of a comparator which is a limitation of an analog memory does not disturb the programming operation, which is accomplished such that the same input and output paths for signals are used during the programming and reading operations of cells in the array. Therefore, theoretically, the value measured irrespective of the input offset voltages generated during the programming operation is identical with the original value by the elimination of offset errors.

Also, during the programming operation of a selected cell, the influence on the information change of an adjacent cell can be simply prevented by applying voltages. In other words, an intermediate voltage ($V_{mid}$) enough to maintain A low voltage difference is applied to a non-selected cell so as not to generate a tunneling injection. (Conventionally, a separate path transistor is required for preventing the influence of the information change of the adjacent cell, which makes the circuitry complex.)

Although an illustrative embodiment of the present invention has been described with an example of a 2×2 cell array, it is to be understood that the invention is not limited to such precise embodiment, and that various changes and modifications may be effected to these embodiments by one skilled in the art without departing from the scope or spirit of the invention as defined in the appended claims. For example, the programming operation may be performed in parallel by providing a comparator and a controller for each column. Also a cell array of greater size than 2×2 may be used.

What is claimed is:

1. An analog memory comprising:

a memory cell comprising a control gate to which a first high-voltage pulse signal is applied, an injector to which a second high-voltage pulse signal is applied, and a floating gate to which charges are injected or erased through the injector;

comparing means having a differential input stage with a reference voltage signal as a first input and a voltage signal of the floating gate as a second input, the comparing means operating to compare and output the difference between the first and second input signals;

mode selecting means for connecting the output of the comparing means to the first input of the comparing means to function as a unit amplifier during a reading mode, and for connecting an external reference voltage signal to the first input of the comparing means during a writing mode; and controlling means for maintaining a program enable state if a current state of the output signal of the comparing means is the same as a previous state of the output signal of the comparing means, for maintaining a program disable state if the current state of the output signal of the comparing means is not the same as a previous state of the output signal of the comparing means, and for generating the first and second high-voltage pulse signals in accordance with the state of the output signal of the comparing means, wherein during the writing mode, analog information is written into the memory cell by injecting charges into or erasing charges from the floating gate, and wherein, during the reading operation, the floating gate voltage signal is unit-gain-amplified and then output.

2. An analog memory as recited in claim 1, wherein the charges are injected into or erased from the floating gate by comparing the external reference voltage signal and the floating gate voltage signal and controlling the first and second-high-voltage pulse signals applied to the control gate and injector so that the floating gate voltage signal is adjusted to make it similar to the external reference voltage signal.

3. An analog memory as recited in claim 1, wherein the controller comprises:

a program enable detector for controlling the start and finish of a program by sampling the output signal of the comparing means during a predetermined time interval to identify a change of the output signal state;

a program-type detector for generating a write or erase mode signal in accordance with the state of the output signal of the comparing means;

a first high-voltage pulse generator connected to the control gate of the memory cell for generating the first high-voltage pulse signal in response to a detection signal output from the program enable detector and the write mode signal output from the program type detector; and a second high-voltage pulse generator connected to the injector of the memory cell for generating the second high-voltage pulse signal in response to the detection signal output from the program enable detector and the erase mode signal output from the program type detector.

4. An analog memory comprising:

a cell array comprising a plurality of memory cells, each memory cell having a control gate to which a first high-voltage pulse signal is applied, an injector to which a second high-voltage pulse signal is applied, and a floating gate to which charges are injected into or are erased from through the injector, each memory cell being selected in response to an external address signal, the floating gate being one input part of a differential input stage;

comparing means having the differential input stage with a reference voltage acting as a first input and a floating gate voltage signal of a memory cell selected from the plurality of memory cells acting as a second input, the comparing means acting to compare and output the difference between the reference voltage signal and the floating gate voltage signal;

mode selecting means for connecting the output of the comparing means to the first input of the comparing means to cause the comparing means to function as a unit amplifier during a reading mode, and for connecting an external reference voltage signal to the first input of the comparing means during a writing mode; and controlling means for maintaining a program enable state if the current state of the output signal of the comparing means is the same as that previous state of the output signal of the comparing means, maintaining a program disable state if the current state of the output signal of the comparing means is not the same as the previous state of the output signal of the comparing means, and for generating the first and second high-voltage pulse signals in accordance with the state of the output signal of the comparing means, wherein during the writing operation, analog information is written into the memory cell by injecting charges into the floating gate or erasing charges from the floating gate and wherein during the reading operation, the floating gate voltage signal is amplified and then output.

5. An analog memory as claimed in claim 4, by comparing the external reference voltage signal and the floating gate voltage signal of the selected memory cell, controlling the first and second high-voltage pulse signals applied to the control gate and injector of the selected memory cell so that the floating gate voltage signal becomes a target voltage similar to the external reference voltage signal, and controlling the first and second high-voltage pulse signals of the non-selected memory cells not to disturb the selected memory cell.

6. An analog memory as claimed in claim 4, wherein the controller includes a program enable detector for controlling the start and finish of a program by sampling the output signal of the comparing means during a predetermined time interval to identify a change of the output signal state;

a program type detector for generating a write or erase mode signal in accordance with the state of the output signal of the comparing means;

a plurality of first high-voltage pulse generators, each connected to a control gate of a memory cell in the plurality of memory cells, for generating the first high-voltage pulse signal during a selection period and for generating an intermediate voltage lower than the high voltage during a non-selection period, in response to a detection signal output from the program enable detector and the write mode signal output from the program type detector; and a plurality of second high-voltage pulse generators, each connected to an injector of a memory cell in the plurality of memory cells, for generating the second high-voltage pulse signal during a selection period and an intermediate voltage lower than the high voltage during a non-selection period, in response to the detection signal output from the program enable detector and the erase mode signal output from the program type detector.

* * * * *